(12) United States Patent
Lin et al.

(10) Patent No.: US 7,501,226 B2
(45) Date of Patent: Mar. 10, 2009

(54) IMMERSION LITHOGRAPHY SYSTEM WITH WAFER SEALING MECHANISMS

(75) Inventors: Burn Jeng Lin, Hsinchu (TW);
Tsai-Sheng Gau, Hsinchu (TW);
Chun-Kung Chen, Chunli (TW);
Ru-Gun Liu, Hsinchu (TW); Shing Shen Yu, Hsinchu (TW); Jen Chieh Shih, Yongkang (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 153 days.

(21) Appl. No.: 10/874,982

(22) Filed: Jun. 23, 2004

(65) Prior Publication Data
US 2005/0286033 A1    Dec. 29, 2005

(51) Int. Cl.
*G03B 27/52* (2006.01)
(52) U.S. Cl. .............................. 430/311; 355/53; 355/30
(58) Field of Classification Search .................. None
See application file for complete search history.

(56) References Cited

U.S. PATENT DOCUMENTS

| 2004/0075895 A1 * | 4/2004 | Lin | ........................... 359/380 |
| 2004/0160582 A1 * | 8/2004 | Lof et al. | ....................... 355/30 |
| 2005/0264778 A1 * | 12/2005 | Lof et al. | ....................... 355/53 |

OTHER PUBLICATIONS

Soichi, Owa, et al., "Immersion Lithography Tool Update", Sematech 3rd Immersion Workshop, Jul. 2003, pp. 1-51.

* cited by examiner

*Primary Examiner*—Daborah Chacko Davis
(74) *Attorney, Agent, or Firm*—K & L Gates LLP

(57) ABSTRACT

An immersion lithography system is disclosed to comprise a fluid containing feature for providing an immersion fluid for performing immersion lithography on a wafer, and a seal ring covering a predetermined portion of a wafer edge for preventing the immersion fluid from leaking through the covered portion of the wafer edge while the fluid is used for the immersion lithography.

22 Claims, 3 Drawing Sheets

IMMERSION LITHOGRAPHY SYSTEM WITH WAFER SEALING MECHANISMS

BACKGROUND

The present disclosure relates generally to immersion lithography processes used for the manufacture of semiconductor devices, and more particularly to the immersion lithography systems' capability for the control and containment of the immersion lens liquid during the systems' processing operations.

The manufacture of very large-scale integrated (VLSI) circuits requires the use of many photolithography process steps to define and create specific circuits and components onto the semiconductor wafer (substrate) surface. Conventional photolithography systems comprise of several basic subsystems, a light source, optical transmission elements, photo mask reticles, and electronic controllers. These systems are used to project a specific circuit image, defined by the mask reticles, onto a semiconductor wafer coated with a light sensitive film (photoresist) coating. As VLSI technology advances to higher performance, circuits become geometrically smaller and denser, requiring lithography equipment with lower resolution (smaller feature size) projection and printing capability. Such equipment is now required to be capable of producing features with feature resolutions smaller than 100 nanometers (nm). As new device generations are developed requiring even further improvements, of feature resolutions 65 nm and lower, major advancements to photolithography processing are required.

Immersion lithography has been implemented to take advantage of the process technology's capability for much improved resolution. Immersion lens lithography features the usage of a liquid medium to fill the entire gap between the last objective lens element of the light projection system and the semiconductor wafer (substrate) surface during the light exposure operations of the photoresist pattern printing process. The liquid medium used as the immersion lens provides an improved index of refraction for the exposing light, thus improving the resolution capability of the lithographic system. This is represented by the Rayleigh Resolution formula, $R=k_1 \lambda / N.A.$, where R (feature size resolution) is dependant upon $k_1$ (certain process constants), $\lambda$ (wavelength of the transmitted light) and the N.A. (Numerical Aperture of the light projection system). It is noted that N.A. is also a function of the index of refraction where $N.A.=n \sin\theta$. Variable n is the index of refraction of the liquid medium between the objective lens and the wafer substrate, and is $\theta$ the acceptance angle of the lens for a transmitted light.

It can be seen that as the index of refraction (n) becomes higher for a fixed acceptance angle, the numerical aperture (N.A.) of the projection system becomes larger thus providing a lower R value, i.e. a higher resolution. Conventional immersion lithographic systems utilize de-ionized water as the immersion fluid between an objective lens and the wafer substrate. At one of the wavelengths, for example 193 nm, de-ionized water at 20 degree Celsius has an index of refraction at approximately 1.44 versus air which has an index of refraction at approximately 1.00. It can be seen that immersion lithographic systems utilizing de-ionized water as the immersion fluid, offers a significant improvement to the resolution of the photolithography processes.

FIG. 1 is a cross-sectional diagram that illustrates a typical immersion lithography system. The immersion printing section 100 of the lithography system contains a movable wafer chuck/stage 102 incorporated with vacuum channels 104 for holding and fixing the photoresist coated wafer 106 onto the top of the wafer chuck/stage 102. The immersion fluid 108 is shown located on top of the photoresist coated wafer 106 displacing the entire volume of space between the wafer and the last objective lens element 110 of the lithography's light projection system. The immersion fluid 108 is in direct contact with both the top surface of the photoresist coated wafer 106 and the lower surface of the objective lens element 110.

There are two fluid reservoirs directly connected to the fluid of the water immersion area 109. A fluid supply reservoir 112 serves as the means for supplying and injecting the immersion fluid into the immersion area 109 just under the objective lens element 110. The injected immersion fluid is either held by capillary forces immersion area or contained within a fixture moving with the lens. A typical thickness of the immersion fluid is between 1 to 2 millimeters (mm). A fluid recovery reservoir 114 serves as the means for recovering and accepting the output fluid flow from the immersion lens 108. It is noted that the immersion fluid flow is of the direction starting from the fluid supply reservoir 112, through the immersion area 108, and out to the fluid recovery reservoir 114. There may be associated mechanical hardware and electrical/electronic controllers by which the flow of immersion fluid as described above, is managed and controlled. The large downward arrows 116 of FIG. 1 located above the lithography system's last objective lens element 110 represents the direction of and the transmission of the pattern image-exposing light 116 towards the objective lens element 110 and through the immersion lens 108 to the photoresist coated wafer 106. During normal operation of the immersion lithography printing of the photoresist coated wafer 106, the wafer chuck 102 moves to position each exposure target area of the wafer under the fixed locations of the immersion fluid 108, the fluid reservoirs 112 and 114, the objective lens element 110 and the pattern image-exposing light 116.

The typical immersion lithography system as configured and described by FIG. 1 is effective for performing the immersion lithography process operations. There are several issues with the practical aspects of the physical configurations and procedures that may influence the quality of the immersion lithography process as well as the operational efficiency of the system. FIG. 2 helps to illustrate these issues. FIG. 2 is a cross-sectional diagram of a typical immersion lithography system, similar to FIG. 1, but showing the hardware component locations during processing at the edge of the wafer substrate. The immersion printing section 200 of the lithography system is shown with the movable wafer chuck/stage 202 incorporated with vacuum channels 204 for holding and fixing the photoresist coated wafer 206 onto the top of the wafer stage 202. The immersion fluid 208 is shown located on top of the photoresist coated wafer 206 displacing the entire volume of space between the wafer and the last objective lens element 210 of the lithography's light projection system. The fluid 208 is in direct contact with both the top surface of the photoresist coated wafer 206 and the lower surface of the objective lens element 210. The two fluid reservoirs, the fluid supply reservoir 212 and the fluid recovery reservoir 214, are directly connected to the fluid 208.

The immersion fluid 208 is shown located at the edge of the wafer substrate 206 to perform processing upon the photoresist areas at the wafer edge. At the wafer substrate edge, the normally closed-loop flow of the immersion fluid from the fluid supply reservoir 212, through the immersion area 209 to the fluid recovery reservoir 214 is different than that previously described for FIG. 1. As shown in FIG. 2, there is now an additional path 215 for the output flow of the immersion fluid which occurs when processing at the wafer substrate edge. This additional path 215 allows the immersion fluid to flow out of the immersion lens 208, reservoirs loop along the outside edge of the wafer substrate 206, and the outside edge of the movable wafer chuck/stage 202, not returning back into the fluid recovery reservoir 214. This uncontrolled, non-containment of immersion fluid itself may not necessarily affect the quality of the immersion lithography process, but may adversely affect the system's operational efficiency. The immersion fluid is not fully recovered, wasted as it flows away from the immersion lens 208 and immersion fluid reservoirs. In addition, the mechanical and electrical components of the wafer chuck 202 and other underlying assemblies may be undesirably wet from the additional flow 215 of immersion fluid. Such undesired wetting and flow may contaminate and shorten the operational life of the system's hardware and electrical components. This issue may require immersion lithography system designers to invest additional time and costs consuming efforts to accommodate the system design and configurations for this additional flow of immersion fluid.

The wafer edge position of the immersion lens 208 also exposes the immersion lithography processing to certain quality issues. During normal wafer processing within the semiconductor processing facilities, the wafer edges have a high propensity to collect particulate contamination. This is due to the fact that the wafer edge is handled more and in closer proximity to particulate generation sources than the interior areas of the wafer substrate. As shown by FIG. 2, when the wafer chuck/stage 202 positions the wafer substrate edge 206 under the immersion lens 208, the immersion fluid contacts particulates located at the wafer substrate edge 206. As result, the particulates may become dislodged from the wafer substrate surface 206 and becomes suspended within the fluid 208. These particulates may then affect the immersion lithography exposing processes enough to distort and disturb the printed image patterns on the wafer substrate. They may also deposit and adhere onto the wafer substrate surface to affect subsequent wafer processing operations. The flow of the immersion fluid to the recovery reservoir 214 and the additional flow 215 out of the immersion area 208 may not be able to keep the particulates from affecting the immersion lithography and subsequent processing operations.

What is desired is an improved system for the sealing and control of the immersion fluid within the immersion area throughout the entire immersion lithography process operations. The improved system would also minimize the introduction of particulates into the immersion fluid by preventing the immersion fluid from contact with the particulate contamination areas. The system would help maintain the integrity of the photoresist image and pattern on the wafers such that they do not become distorted and defective.

SUMMARY

In view of the foregoing, this disclosure provides an immersion lithography system that comprises immersion fluid for performing immersion lithography on a wafer, and a seal ring covering a predetermined portion of a wafer edge for preventing an immersion fluid from leaking through the covered portion of the wafer edge.

The construction and method of operation of the invention, however, together with additional objects and advantages thereof will be best understood from the following description of specific embodiments when read in connection with the accompanying drawings.

DESCRIPTION

The present disclosure describes an improved system and method for sealing and controlling of the immersion fluid within an immersion area throughout the entire immersion lithography exposure processing. The disclosed system has a seal ring device to facilitate the sealing and containment of the immersion fluid to the wafer substrate and immersion fluid reservoirs by covering the wafer substrate edge. The disclosed seal ring is placed and removed from operating position through the use of a disclosed seal ring carrier device. The present disclosure provides several examples of how the seal ring may be implemented within the immersion lithography system. In addition, the present disclosure provides several examples of seal ring carrier designs which may be used within the disclosed immersion lithography system.

The seal ring device of the present disclosure is a thin ring comprised of a soft material such as rubber, plastic, mylar, delrin, Teflon, or of some similar composite materials that can be used for sealing purposes. The disclosed seal ring is constructed such that the thickness of the ring is approximately just smaller than the working distance of the immersion lens, the distance of the space between the wafer substrate surface and the last objective lens element of the light projection system. The inner diameter (which defines the open area) of the seal ring is sized such that a portion of the outer edge and circumference of the wafer substrate is covered/masked by the seal ring with the target locations exposed for the immersion lithography processing of the wafer substrate surface. The outer diameter (outer edge) of the seal ring is sized such that it overlaps the outer edge of the wafer substrate with sufficient seal ring material to obtain a contact seal with the portion of the wafer chuck/stage adjacent to the wafer substrate.

Figure 1:
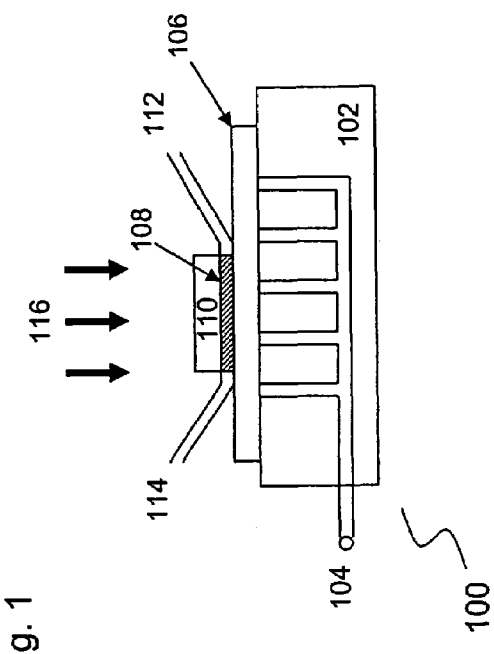
FIG. 1 illustrates a cross-sectional view of a conventional immersion lithography system.
Figure 2:
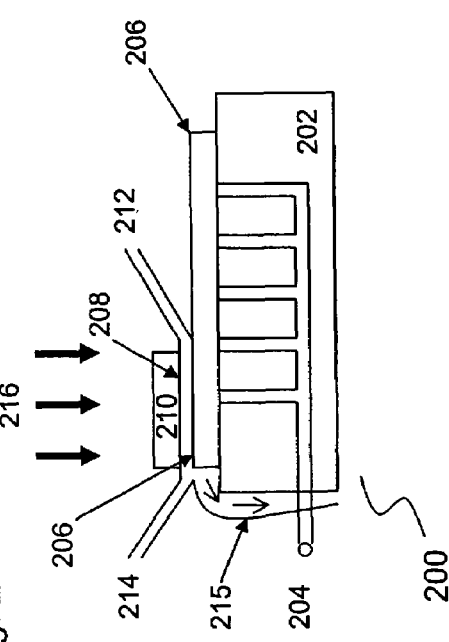
FIG. 2 illustrates a cross-sectional view of the conventional immersion lithography system while processing at a wafer substrate edge area.
Figure 3:
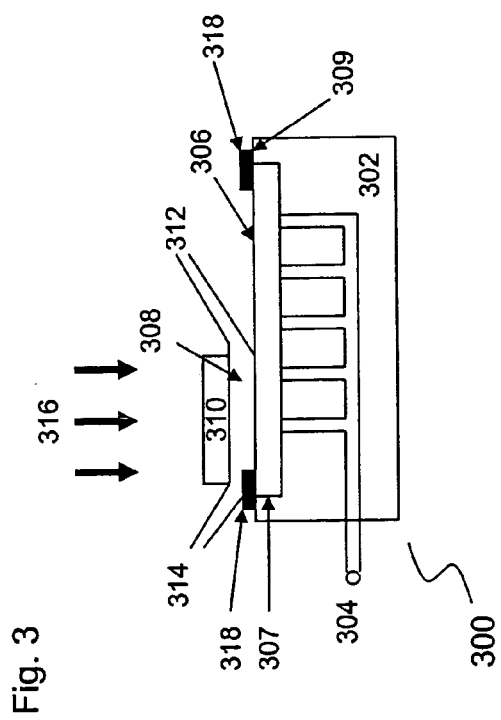
FIG. 3 illustrates a cross-sectional view of one example of the disclosed immersion lithography system for processing on the wafer substrate edge area.

FIG. 3 illustrates an example of the seal ring integrated with the immersion lithography system in accordance with the present disclosure. The immersion printing section 300 of the lithography system is shown with the movable wafer chuck/stage 302 incorporated with vacuum channels 304 for holding and fixing the photoresist coated wafer 306 onto the top of the wafer stage 302. The wafer chuck/stage 302 is constructed with a recess 307, approximately matching the circumference and thickness of the wafer substrate 306, from the top surface to accommodate the placement of the wafer substrate 306 such that the top surface of the wafer substrate 306 is position leveled and flushed (or co-planar) to the top surface of the non-recessed portion of the wafer chuck/stage 302. The immersion fluid 308 is shown located on top of the photoresist coated wafer 306 displacing the entire volume of space between the wafer and the last objective lens element 310 of the lithography's light projection system. The fluid is in direct contact with both the top surface of the photoresist coated wafer 306 and the lower surface of the objective lens element 310. The two fluid reservoirs, the fluid supply reservoir 312 and the fluid recovery reservoir 314, along with other accessories for holding the immersion fluid 308 in the space between the wafer and the lens element 310 may be collectively referred to as a fluid containing feature.

The immersion fluid 308 is shown located at the edge of the wafer substrate 306 to perform processing upon the photoresist areas. At the wafer substrate 306 edge, a seal ring 318 has been placed into position on top of the wafer substrate 306 surface such that the seal ring 318 is in contact with the outer edge of the wafer substrate 306, overlapping and also in contact with a small portion 319 of the wafer chuck/stage that is located adjacent to the wafer substrate 306 edge. The disclosed seal ring 318 confines the immersion fluid within the immersion area 309. The disclosed seal ring 318 prevents the additional flow of immersion fluid out of the water immersion area 318 and from the immersion fluid reservoir areas 312 and 314. As the seal ring 318 confines the immersion fluid, the flow and usage of the fluid is very well controlled and maintained. The fluid flows and usage are the same for the immersion lithography processing at both, the wafer substrate interior and the wafer substrate edge. The immersion fluid loss and waste is minimized and the fluid flow dynamics within the immersion area 309 and the immersion fluid reservoir loop are consistent and stable. It is also noted that the seal ring 318 coverage upon the outer edge of the wafer substrate 306 also prevents the particulate contamination located at the edge of the wafer substrate 306 from contaminating the immersion fluid and wafer substrate 306 surface. As result, the immersion fluid and the immersion area 309 remains clean, free of the particulates which could distort and disturb the immersion lithography process. The benefits of sealing and covering the particulates under the seal ring would also help to prevent free particulates from adhering upon the interior wafer substrate surface to cause harm during subsequent processing operations.

Figure 4:
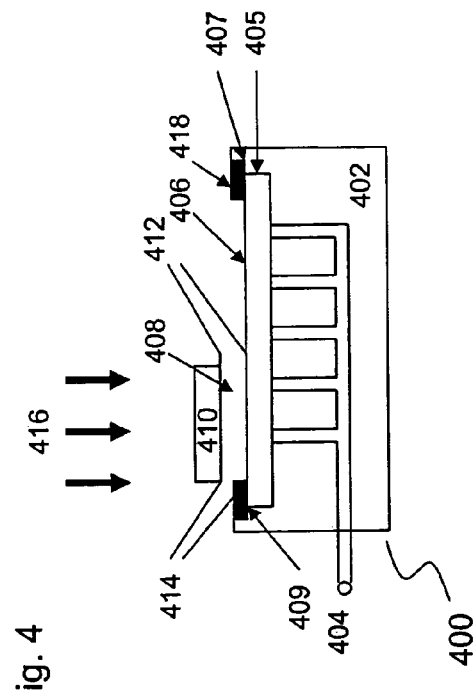
FIG. 4 illustrates a cross-sectional view of a second example of the disclosed immersion lithography system for processing on the wafer substrate edge area.

FIG. 4 illustrates another example of the seal ring installed upon the immersion lithography system in accordance with the present disclosure. The immersion printing section 400 of the lithography system is shown with the movable wafer chuck/stage 402 incorporated with vacuum channels 404 for holding and fixing the photoresist coated wafer 406 onto the top of the wafer stage 402. The wafer chuck/stage 402 is constructed with a double step recess from the top surface. The first step recess 405 of the wafer chuck/stage 402 double step recess, is constructed with a recess approximately matching the circumference and thickness of the wafer substrate 406 to accommodate the placement of the wafer such that the top surface of the wafer is leveled and flushed (or co-planar) to the top surface of the first step recess area. The second step recess 407 is constructed such that the seal ring 418 can be placed within the circumference of the recess, such that the seal ring 418 is in contact with the outer edge of the wafer substrate 406, overlapping and also in contact with a small portion 409 of the second step recess of the wafer chuck/stage 402 that is located adjacent to the wafer. The depth of the second step recess 407 is sized such that the top of the placed seal ring 418 is leveled and flushed (or co-planar) to the outer edge, top surface of the non-recessed areas of the wafer chuck/stage 402.

The immersion fluid 408 is shown located near the edge of the wafer substrate 406 to perform processing upon the photoresist areas. The immersion fluid 408 is located on top of the photoresist coated wafer 406, comprised of the immersion fluid displacing the entire volume of space between the wafer and the last objective lens element 410. The double step structure of the wafer chuck/stage recess allows for the seal ring 418 to seal the immersion fluid within the immersion area 409. The illustration of FIG. 4 also shows that additional outward flow of the immersion fluid is also eliminated. The example of FIG. 4 is also very effective for controlling the usage and flow of the immersion fluid within the immersion lithography system, as well as the minimization of wafer edge particulate contamination introduced into the immersion lithography system and onto the wafer substrate surface.

It is further noted that the designs and styles of the wafer chuck/stages and seal ring may vary as long as effective sealing of the immersion area and immersion fluids are obtained. As an example, a flexible seal ring may be designed and constructed such that the ring extends beyond the coverage of the wafer chuck/stage and extending downward to partially cover or shield the chuck/stage (not illustrated). Another design may allow a semi-rigid, very smooth seal ring to be place onto a smaller diameter wafer chuck/stage such that the seal ring extends on the same plane far beyond the outer edge of the wafer chuck/stage (also not illustrated).

The disclosed seal ring can be placed upon and retrieved from the wafer substrate and wafer chuck/stage by the use of a disclosed seal ring carrier device. The disclosed seal ring carrier is incorporated within the immersion printing section of the immersion lithography system as an extendable, retractable arm that is moved into a position aligned directly over the seal ring for the placement and removal of the same. Once positioned directly over the seal ring, the arm of the seal ring carrier may move vertically for either placement or removal of the seal ring onto the wafer chuck/stage. When the arm of the seal ring carrier is in a position with an attached seal ring off of the wafer chuck/stage, the seal ring arm and carrier may retract and move to another position away from the wafer stage/chuck to perform the storage or alternative placement of the seal ring. There are vacuum channels constructed within the seal ring carrier which open up to small vacuum ports at certain locations for attaching, picking up and transferring of the seal ring by the vacuum force.

Figure 5:
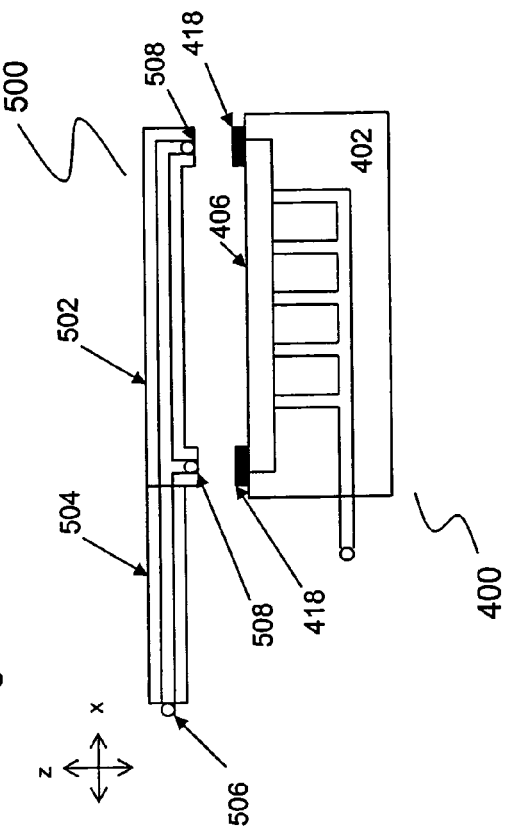
FIG. 5 illustrates a cross-sectional view of an example of the disclosed seal ring carrier incorporated into the immersion lens lithography system.

FIG. 5 illustrates a cross-sectional view of an example of the disclosed seal ring carrier assembly incorporated into an immersion lens lithography system in accordance to the present disclosure. The wafer chuck/stage 400 assembly is shown with a seal ring 418 having been placed into its processing position on the top surface of the wafer chuck/stage 402 and the wafer substrate 406 surface. The seal ring carrier assembly 500 is shown in position aligned directly above the seal ring 418. The seal ring transport assembly 500 comprises of a seal ring carrier 502 attached onto a seal ring arm 504. There are vacuum channels 506 located within the seal ring arm 504 and the seal ring carrier 502. There are seal ring contact points 508 located on certain locations of the seal ring carrier with open ports for applying the channeled vacuum force to attach, pickup and move the seal ring 418 when the seal ring arm 504 of the seal ring carrier 502 is moved to be in contact with the seal ring. It is noted that the seal ring carrier assembly 500 can be extended and retracted on the same x-y plane. Once placed into the predetermined, extended position, the seal ring carrier assembly 500 can be moved up and down in the vertical or z-axis direction to contact with the seal ring 418. The seal ring transport assembly 500 may also be used to move the seal ring 418 into a storage location or some other location away from the wafer chuck/stage assembly 400.

Figure 6C:
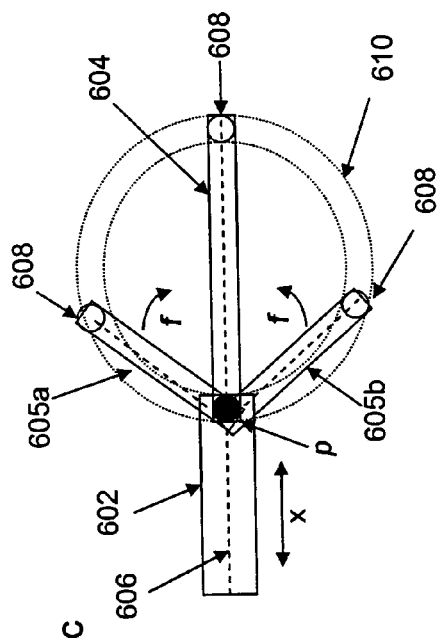
FIGS. 6A through 6D are bottom views of the disclosed seal ring carrier for an immersion lens lithography system according to several examples of the present disclosure.
Figure 6D:
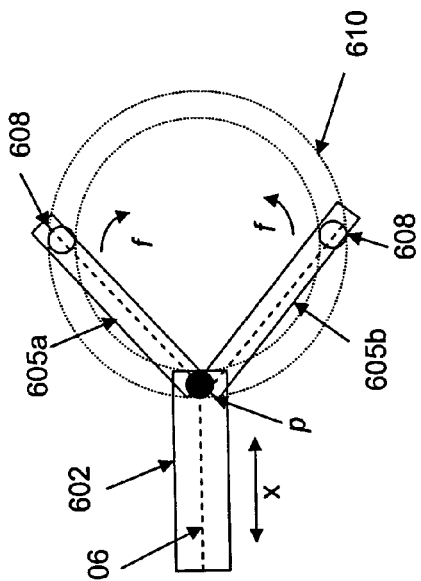
Figure 6A:
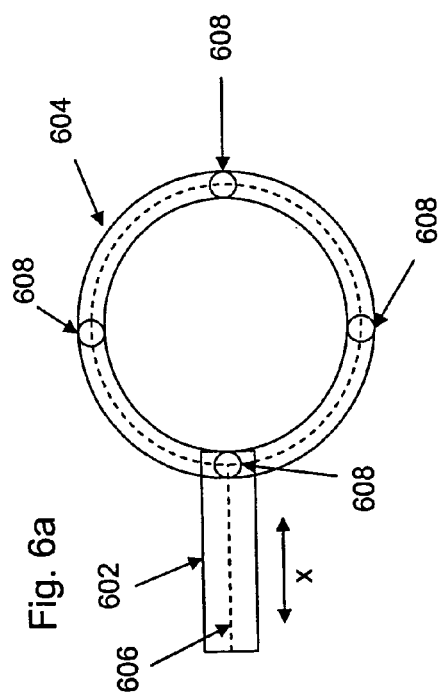

FIGS. 6A through 6D illustrate bottom views of several different examples of the disclosed seal ring carrier in accordance with the present disclosure. The following described seal ring carrier designs, 6A through 6D, all function as previously described, yet each design features a uniquely different physical construction and/or shape. FIG. 6A is a seal carrier constructed as a ring structure. There is a seal ring carrier arm 602 by which a ring-shaped seal ring carrier 604 is attached to its end. The ring-shaped seal ring carrier 604 is sized such that the seal ring carrier's circumferences and diameters are approximately the same as the seal ring. There are vacuum channels 606 constructed within the seal ring carrier arm 602 and seal ring carrier 604 to distribute and route vacuum to the small vacuum port openings 608 located on the certain seal ring contact locations of the seal ring carrier 604.

Figure 6B:
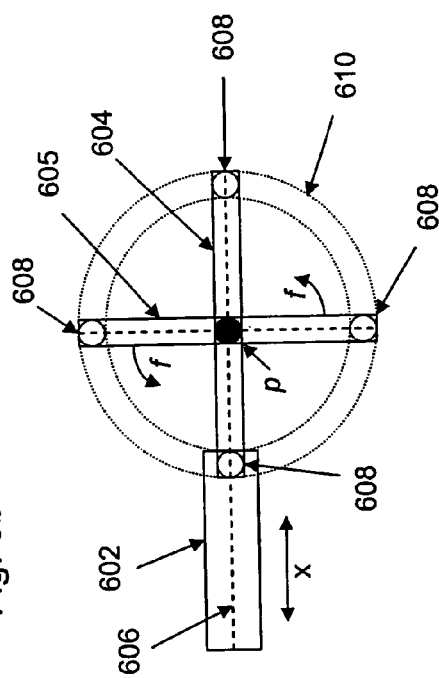

FIG. 6B is a seal carrier constructed as a foldable cross structure. There is a seal ring carrier arm 602 by which a foldable cross structure seal ring carrier, comprised of one fixed arm 604 and one foldable arm 605 is attached to the seal ring carrier arm's 602 end. The one foldable arm 605 is unfolded to a position such that its axis is perpendicular to the axis of the fixed arm 604, forming a cross shape when the seal ring carrier arm 602 is extended to its operation position. There are vacuum channels 606 constructed within the seal ring carrier arm 602 and the two cross arms 604 and 605 of the seal ring carrier to distribute and route vacuum to the small vacuum port openings 608 located on the certain seal ring contact locations of the seal ring carrier arms 604 and 605. The configurations of the seal carrier arms 604 and 605 and placements of the vacuum port openings 608 are such that the port openings may obtain contact with the seal ring 610. It is noted that the movable seal carrier arm 605 is moved and aligned into the unfolded position for picking up and moving the seal ring 610. The folded position of the movable cross arm 605 is such that the folding arm 605 is folded in the directions f at a pivot point p to align the folded arm 605. The folding feature of this seal ring carrier design allows for the seal ring carrier to obtain a smaller, compact hardware profile for its storage and movements within the immersion lithography system.

FIG. 6C is a seal carrier constructed as another foldable structure design. There is a seal ring carrier arm 602 by which a foldable structure seal ring carrier, comprised of one fixed arm 604 and two foldable arms 605a and 605b are attached to the seal ring carrier arm 602. There are also vacuum channels 606 constructed within the seal ring carrier arm 602 and the two foldable arms 605a and 605b such that their small vacuum port openings 608 are aligned to a ring shape with circumferences and diameters approximately the same as the seal ring 610. The two foldable arms 605a and 605b are not necessarily of like lengths and dimensions, but are folded at a pivot point p located at the end attaching the seal ring carrier arm 602. Each foldable arm 605a or 605b, unfolds to their operating positions upon extension of the seal ring carrier arm 602 to its operating position. When the seal ring carrier arm 602 needs to be retracted, the two foldable arms 605a and 605b fold inward in the directions f starting at the pivot point p to align the folded arms either on top of or below the fixed arm 604. The folding seal ring carrier design of FIG. 6C also allows for the seal ring carrier to obtain a smaller, compact hardware profile for its storage and movements within the immersion lithography system.

FIG. 6D illustrates a seal carrier that has no fixed arms and only two foldable arms 605a and 605b. As with the foldable arms of the FIG. 6C example, the two foldable arms 605a and 605b, each may fold inward in the directions f at a pivot point p located at the end attached to the seal ring carrier arm 602. This example features fewer vacuum attachment openings and fewer arms to help demonstrate the flexibility of various seal arm and seal carrier designs. The presented examples of various seal arms and seal carrier designs all perform the required functions of attaching, picking up and the movements of the disclosed seal rings.

The disclosed system and method of using the disclosed seal ring and seal ring carrier provides an effective means for the containment of the immersion fluid—during the immersion lithography exposure processing. The placement of a soft seal ring onto the edge of the wafer substrate surface and the wafer chuck/stage perimeter facilitates the containment of the immersion fluid to the wafer substrate and immersion fluid reservoirs at the wafer substrate edge throughout the entire immersion lithography processing operation. The disclosed seal ring is placed and removed from its operating position through the use of a disclosed seal ring carrier device. The immersion fluid is controlled, and conserved without much waste and loss. Additionally, the use of the disclosed seal ring also minimizes the introduction of particulates into the immersion fluid by preventing the immersion fluid from contacting the covered wafer edge. As result, the immersion lithography and subsequent processing operations achieve a higher level of quality and integrity, and generating photoresist images and patterns of less distortion and defectivity.

The present disclosure provides several examples to illustrate the flexibility of how the disclosed seal ring and seal ring carrier may be implemented. The disclosed methods and devices may be easily implemented into existing system designs and flows as well as into their fabrication facilities and operations. The methods and devices of the present disclosure may also be implemented into present advanced technology immersion lithography systems utilizing 150 nm to 450 nm exposing light wavelengths, as well as future systems utilizing even shorter wavelengths. The disclosed methods and specified system will allow for the manufacturing of advanced semiconductor devices of high reliability, high performance and high quality.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in a design for performing immersion lithography, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. An immersion lithography system for performing immersion lithography on a wafer, comprising:
   a wafer stage for receiving and holding the wafer thereon;
   a fluid containing feature for providing an immersion fluid;
   a seal ring covering a predetermined portion of a wafer edge for preventing the immersion fluid from leaking through the covered portion of the wafer edge, the seal ring being removable from the wafer edge; and
   a ring-shaped seal ring carrier structure configured to attach, pick up, and move the seal ring from the wafer by a vacuum force, the structure comprises:
   a seal ring carrier arm;
   a ring-shaped seal ring carrier attached to the seal ring carrier arm;

a vacuum channel constructed within the seal ring carrier arm and the ring-shaped seal ring carrier; and vacuum port openings formed on seal ring contact locations of the ring-shaped seal ring carrier.

2. The system of claim 1 wherein the wafer stage includes a double step recess structure with a first step being substantially co-planar with a top surface of the wafer, and a second step being substantially co-planar with a top surface of the seal ring disposed atop the wafer and the first step of the recess structure for receiving the wafer and the seal ring.

3. The system of claim 1 wherein the seal ring extends beyond the wafer edge.

4. The system of claim 1 wherein the seal ring is a soft seal ring.

5. The system of claim 1 wherein the seal ring is made of rubber.

6. The system of claim 1 wherein the seal ring is made of mylar or Teflon.

7. An immersion lithography system for performing immersion lithography on a wafer, comprising:
   a wafer stage for receiving and holding the wafer thereon;
   a fluid containing feature for providing an immersion fluid;
   a seal ring covering a predetermined portion of a wafer edge for preventing the immersion fluid from leaking through the covered portion of the wafer edge, the seal ring being removable from the wafer edge; and
   a foldable cross-shaped seal ring carrier structure configured to attach, pick up, and move the seal ring from the wafer by a vacuum force, the structure comprises:
   a seal ring carrier arm;
   at least one fixed arm and at least one foldable arm attached to the seal ring carrier arm, wherein the foldable arm and the fixed arm form a cross shape when the seal ring carrier arm is extended to its operation position;
   a vacuum channel constructed within the seal ring carrier arm, the fixed arm, and the foldable arm; and
   vacuum port openings formed on seal ring contact locations of the fixed arm and the foldable arm.

8. The system of claim 7 wherein the wafer stage includes a double step recess structure with a first step being substantially co-planar with a top surface of the wafer, and a second step being substantially co-planar with a top surface of the seal ring disposed atop the wafer and the first step of the recess structure for receiving the wafer and the seal ring.

9. The system of claim 7 wherein the seal ring carrier structure has one or more arms for securing the seal ring therewith.

10. The system of claim 7 wherein the seal ring carrier structure uses vacuum force for securing the seal ring.

11. An immersion lithography system for performing immersion lithography on a wafer, comprising:
    a wafer stage for receiving and holding the wafer thereon;
    a fluid containing feature for providing an immersion fluid;
    a seal ring covering a predetermined portion of a wafer edge for preventing the immersion fluid from leaking through the covered portion of the wafer edge, the seal ring being removable from the wafer edge; and
    a foldable seal ring carrier structure configured to attach, pick up, and move the seal ring from the wafer by a vacuum force, the structure comprises:
    a seal ring carrier arm;
    at least one fixed arm and at least two foldable arms attached to the seal ring carrier arm, wherein the at least two foldable arms are folded at a pivot point located at an end of the seal ring carrier arm;
    a vacuum channel constructed within the seal ring carrier arm, the fixed arm, and the foldable arms; and
    vacuum port openings formed on seal ring contact locations of the fixed arm and the foldable arms.

12. The system of claim 11 wherein the wafer stage includes a double step recess structure with a first step being substantially co-planar with a top surface of the wafer, and a second step being substantially co-planar with a top surface of the seal ring disposed atop the wafer and the first step of the recess structure for receiving the wafer and the seal ring.

13. The system of claim 11 wherein the seal ring carrier structure has one or more arms for securing the seal ring therewith.

14. The system of claim 11 wherein the seal ring carrier structure uses vacuum force for securing the seal ring.

15. The system of claim 11 wherein the seal ring is a soft seal ring.

16. The system of claim 11 wherein the seal ring is made of a flexible sealing material.

17. An immersion lithography system for performing immersion lithography on a wafer, comprising:
    a wafer stage for receiving and holding the wafer thereon;
    a fluid containing feature for providing an immersion fluid;
    a seal ring covering a predetermined portion of a wafer edge for preventing the immersion fluid from leaking through the covered portion of the wafer edge, the seal ring being removable from the wafer edge; and
    a foldable seal ring carrier structure configured to attach, pick up, and move the seal ring from the wafer by a vacuum force, the structure comprises:
    a seal ring carrier arm;
    at least two foldable arms attached to the seal ring carrier arm, wherein each of the foldable arms unfolds to its operating position upon extension of the seal ring carrier arm to its operating position;
    a vacuum channel constructed within the seal ring carrier arm and the foldable arms; and
    vacuum port openings formed on seal ring contact locations of the foldable arms.

18. The system of claim 17 wherein the wafer stage includes a double step recess structure with a first step being substantially co-planar with a top surface of the wafer, and a second step being substantially co-planar with a top surface of the seal ring disposed atop the wafer and the first step of the recess structure for receiving the wafer and the seal ring.

19. The system of claim 17 wherein the seal ring extends beyond the wafer edge.

20. The system of claim 17 wherein the seal ring is a soft seal ring.

21. The system of claim 17 wherein the seal ring is made of rubber.

22. The system of claim 17 wherein the seal ring is made of mylar or Teflon.

* * * * *